US012095416B2

United States Patent
Emanet et al.

(10) Patent No.: US 12,095,416 B2
(45) Date of Patent: Sep. 17, 2024

(54) SOLAR POWER GENERATION SYSTEM EQUIPMENT MOUNTING USING CABLE-CLIPS

(71) Applicant: Monitek L.L.C., East Greenwich, RI (US)

(72) Inventors: Nahit Emanet, Istanbul (TR); Oezguer Aksoy, Miami, FL (US)

(73) Assignee: Monitek, LLC, Miami, FL (US)

( * ) Notice: Subject to any disclaimer, the term of this patent is extended or adjusted under 35 U.S.C. 154(b) by 236 days.

(21) Appl. No.: 17/709,503

(22) Filed: Mar. 31, 2022

(65) Prior Publication Data

US 2023/0318527 A1  Oct. 5, 2023

(51) Int. Cl.
 H02S 40/34 (2014.01)
 H02G 3/10 (2006.01)
 (Continued)

(52) U.S. Cl.
 CPC ............ *H02S 40/34* (2014.12); *H02G 3/10* (2013.01); *H02S 40/36* (2014.12); *H05K 5/0247* (2013.01)

(58) Field of Classification Search
 CPC .......... H02S 40/34; H02S 40/36; H02G 3/10; H02G 3/32; H05K 5/0247; H05K 5/03;
 (Continued)

(56) References Cited

U.S. PATENT DOCUMENTS 3,606,223 A  9/1971 Havener
8,472,220 B2 6/2013 Garrity et al.
(Continued)

FOREIGN PATENT DOCUMENTS

CN 105515520 A 4/2016
IN 3446CHE2013 A 2/2015
(Continued)

OTHER PUBLICATIONS

Tesla Solar Inverter and Solar Shutdown Device Datasheet Feb. 2, 2022, North America.
(Continued)

*Primary Examiner* — James Wu
*Assistant Examiner* — Dakota M Talbert
(74) *Attorney, Agent, or Firm* — Mitch Harris, Atty at Law, LLC; Andrew M. Harris

(57) ABSTRACT

A method of mounting an electronic control module to a solar panel of a solar power generation system provides for ease of installation with a reduced parts inventory. The methods electrically connect an electrical connection of the electronic control module to the solar power generation system with one or more cables extending from an electronic control module housing, and a pair of identical cable clips configured for attachment of a standard cable to a frame of the solar panel are used to secure either the cables or protrusions extending from the housing to a frame of the solar panel with the cable clips. The electronic control module may include an electronic circuit, a housing surrounding the electronic circuit, the cables extending from the electronic circuit and through the housing, and protrusions extending from the housing and having a cross-sectional profile configured to approximate a cross-sectional profile of a standard cable.

22 Claims, 16 Drawing Sheets

(51) Int. Cl.
*H02S 40/36* (2014.01)
*H05K 5/02* (2006.01)
(58) Field of Classification Search
CPC .................. H05K 5/02; H05K 5/0217; H05K 2201/10143; F24S 25/61; F24S 25/20; F24S 2025/014; F24S 25/632; F24S 2025/6002; F24S 2025/6004; F24S 25/634; F24S 2020/10; F24S 2025/6003
See application file for complete search history.

(56) References Cited

U.S. PATENT DOCUMENTS

| | | | |
|---|---|---|---|
| 8,542,512 | B2 | 9/2013 | Garrity |
| 9,035,491 | B2 | 5/2015 | Ishii et al. |
| 9,099,849 | B2 | 8/2015 | Shmukler et al. |
| 9,197,154 | B2* | 11/2015 | Wei .................. H02S 40/34 |
| 9,337,771 | B2 | 5/2016 | Guo |
| 9,525,286 | B2 | 12/2016 | Kohler |
| 9,706,660 | B1 | 7/2017 | Mostoller et al. |
| D798,231 | S | 9/2017 | Duenser |
| 9,876,360 | B2 | 1/2018 | Kravitz et al. |
| 9,977,452 | B2 | 5/2018 | Qahouq |
| 10,090,701 | B2 | 10/2018 | Yamada et al. |
| 10,103,547 | B2 | 10/2018 | McNamara |
| 10,134,933 | B2 | 11/2018 | Hudson |
| 10,178,789 | B2 | 1/2019 | Krinitt et al. |
| 10,224,870 | B2 | 3/2019 | Lester et al. |
| 10,305,273 | B2 | 5/2019 | Zhu et al. |
| 10,355,638 | B2 | 7/2019 | Lu |
| 10,587,220 | B2 | 3/2020 | De Vogel et al. |
| 10,998,761 | B2 | 5/2021 | Judkins et al. |
| 11,171,491 | B2 | 11/2021 | Handelsman et al. |
| 11,177,770 | B2 | 11/2021 | Xu et al. |
| 11,689,011 | B2 | 6/2023 | Pursifull |
| 11,728,844 | B2 | 8/2023 | Mahkota et al. |
| 11,866,217 | B2 | 1/2024 | Ogura et al. |
| 11,929,607 | B2 | 3/2024 | Emanet et al. |
| 2010/0288554 | A1 | 11/2010 | Jafari |
| 2014/0366931 | A1* | 12/2014 | Chiu .................. H02S 20/23 136/251 |
| 2015/0236638 | A1 | 8/2015 | Moslehi |
| 2016/0211797 | A1 | 7/2016 | Zhu et al. |
| 2017/0207743 | A1 | 7/2017 | Lemos et al. |
| 2018/0309301 | A1 | 10/2018 | Wang |
| 2019/0074684 | A1 | 3/2019 | Craciun et al. |
| 2019/0140589 | A1 | 5/2019 | Yen et al. |
| 2020/0382053 | A1* | 12/2020 | Wares .................. H02S 30/10 |
| 2021/0328545 | A1 | 10/2021 | Kim |
| 2021/0408964 | A1 | 12/2021 | Wang et al. |
| 2022/0109399 | A1 | 4/2022 | Ogura et al. |
| 2022/0255500 | A1 | 8/2022 | Ogura et al. |

FOREIGN PATENT DOCUMENTS

| | | |
|---|---|---|
| KR | 100870705 B1 | 11/2008 |
| WO | WO-2021000253 A1 | 1/2021 |
| WO | WO-2021024339 A1 | 2/2021 |
| WO | WO-2021038916 A1 | 3/2021 |
| WO | WO-2020174657 A1 | 12/2021 |

OTHER PUBLICATIONS

Office Action in U.S. Appl. 17/569,970 mailed on Dec. 2, 2022 (pp. 1-18 in pdf).
Final Office Action in U.S. Appl. No. 17/569,970 mailed on Jun. 20, 2023 (pp. 1-13 in pdf).
Notice of Allowance in U.S. Appl. No. 17/569,970 mailed on Jan. 19, 2024 (pp. 1-8 in pdf).
Tigo, "Tigo TS4-A-2F", downloaded from https://www.tigoenergy.com/products/ts4-a-2f on Jan. 13, 2022, 7 pages (pp. 1-7 in pdf).
Tigo, Tigo TS4 Brochure, downloaded from https://assets-global.website-files.com/5fad551d7419c7a0e9e4aba4/61b2a5eba1a8735c590e8b44_TS4-A-F(700W) (Fire Safety Add-on) Datasheet EN_12092021.pdf on Jan. 13, 2022, 3 pages (pp. 1-3 in pdf).
IMO, Product Catalog, downloaded from https://www.imoautomation.com/products/73000000 on Jan. 13, 2022, 5 pages (pp. 1-5 in pdf).
AP Smart, AP Smart product literature, downloaded from https://apsmartglobal.com/ on Jan. 13, 2022, 9 pages (pp. 1-9 in pdf).
Northern Electric "Rapid Shutdown Solutions (RSD) PVG-Guard", downloaded from https://northernep.com/products/rapid-shutdown-solutions/ on Jan. 13, 2022, 7 pages (pp. 1-7 in pdf).

* cited by examiner

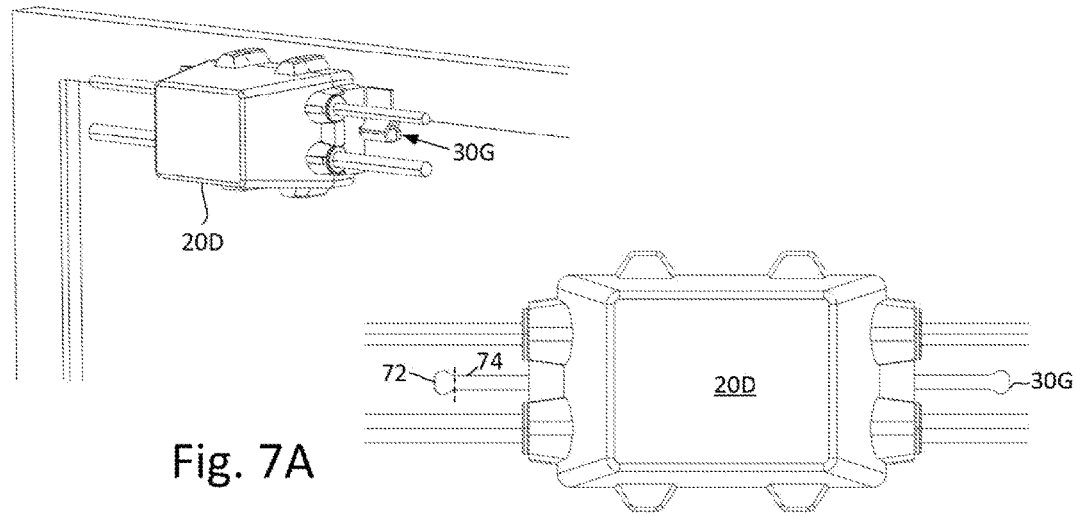
Fig. 7A
Fig. 7C
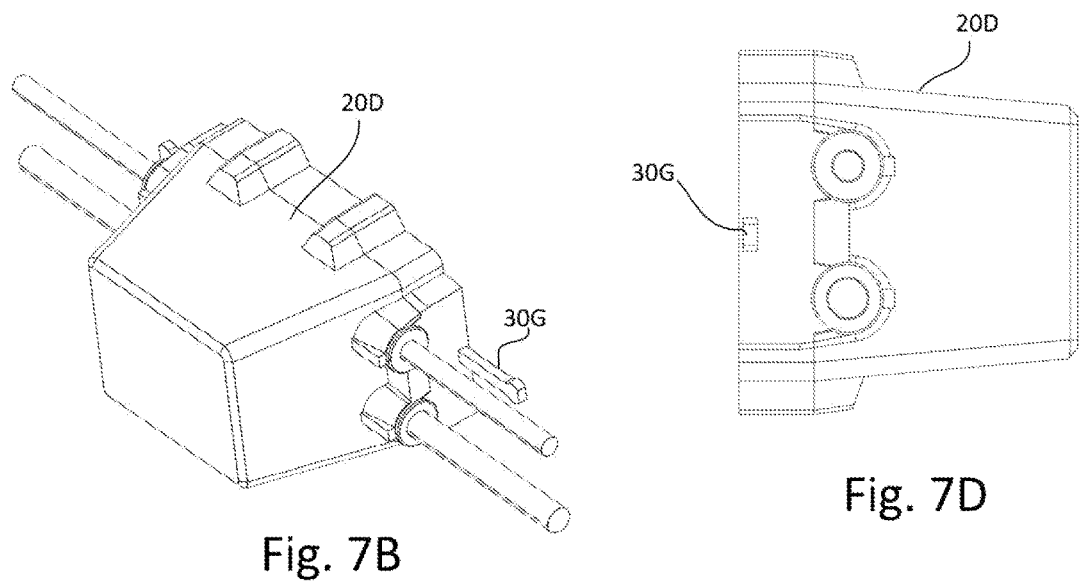
Fig. 7B
Fig. 7D

SOLAR POWER GENERATION SYSTEM EQUIPMENT MOUNTING USING CABLE-CLIPS

BACKGROUND

1. Field of Disclosure

The field of representative embodiments of this disclosure relates generally to mounting systems and techniques for electronic modules, and in particular, to a cable-clip based mounting of solar power generation system equipment, e.g., control modules, to solar panels in a solar power generation system.

2. Description of the Related Art

Solar power generation systems are in widespread use both in systems designed to supplement the commercial power grid and in systems designed for stand-alone operation. Photo-voltaic (PV) power systems are implemented to combine large numbers of solar panels or photo-voltaic arrays (PVAs) having a relatively low output voltage, e.g., 12V, 24V, or 48V and a relatively high output current. Cut-off devices and other control modules may be associated with individual panels or with groups of solar panels and are typically mounted to a back side of a corresponding panel.

Typical mounting configurations for such solar power generation system components include providing threaded mounting studs at a predetermined location on the rear side of the solar panel, or attachment of the control module to the frame of a solar panel using attachment clips or other securing means. However, such attachment mechanisms require either pre-configured mounting locations on the solar panels, or specialized mounting clips, plates, frames, or other fasteners that are adapted to mechanically connect the solar power generation system components to the frame of a solar panel. Such mounting structures decrease flexibility of mounting location and/or increase the cost and number of different parts required of installation of the solar power generation components and solar array installations.

Therefore, it would be desirable to provide a mounting scheme for solar panel/solar array components that provides flexibility of mounting location, while reducing the cost and number of different parts that must be inventoried and used by installers.

SUMMARY

The above objectives, among others, are achieved in solar power generation systems, an electronic control module, and methods of mounting the electronic control module to a solar panel of the solar power generation system.

The methods include electrically connecting at least one electrical connection of the electronic control module to the solar power generation system with one or more cables extending from a housing of the electronic control module, providing a pair of identical cable clips configured for attachment of a standard cable to a frame of the solar panel, first securing a first one of the cables or a first protrusion extending from the housing, to a frame of the solar panel with a first one of the cable clips, and second securing a second one of the cables or a second protrusion extending from the housing to a frame of the solar panel with a second one of the cable clips. The electronic control module may include an electronic circuit, a housing forming an enclosure surrounding the electronic circuit, one or more cables extending from the electronic circuit and through the housing to provided electrical interconnection to the electronic circuit, and a pair of protrusions extending from the housing and having a cross-sectional profile configured to approximate a cross-sectional profile of a standard cable, whereby the housing may be secured to a frame of the solar panel with a standard cable clip.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

BRIEF DESCRIPTION OF THE DRAWINGS

FIG. 7A is an installed right side perspective view, FIG. 7B is a bare upper right-side perspective view, FIG. 7C is a bare top view, and FIG. 7D is a bare left side view, of another example cut-off device 20D that may be used in place of example cut-off device in FIG. 2, FIG. 3A and FIG. 3B in accordance with another embodiment of the disclosure.

DETAILED DESCRIPTION OF ILLUSTRATIVE EMBODIMENT

The present disclosure illustrates solar power generation systems and installation methods in which a housing of an electronic module, such as the electronic cut-off modules described in U.S. patent application Ser. No. 17/569,970 filed on Jan. 6, 2022 entitled "MAINS POWER-OPERATED DISTRIBUTED DISCONNECT FOR SOLAR POWER SYSTEM RAPID SHUTDOWN", the disclosure of which is incorporated herein by reference. The modules are installed by securing protrusions provided on the exterior surface of the housing that have cross-sections configured to approximate a cross-sectional profile of a standard cable with standard cable clips and/or the modules are secured by cables extending from the housing with the standard cable clips.

Figure 1:
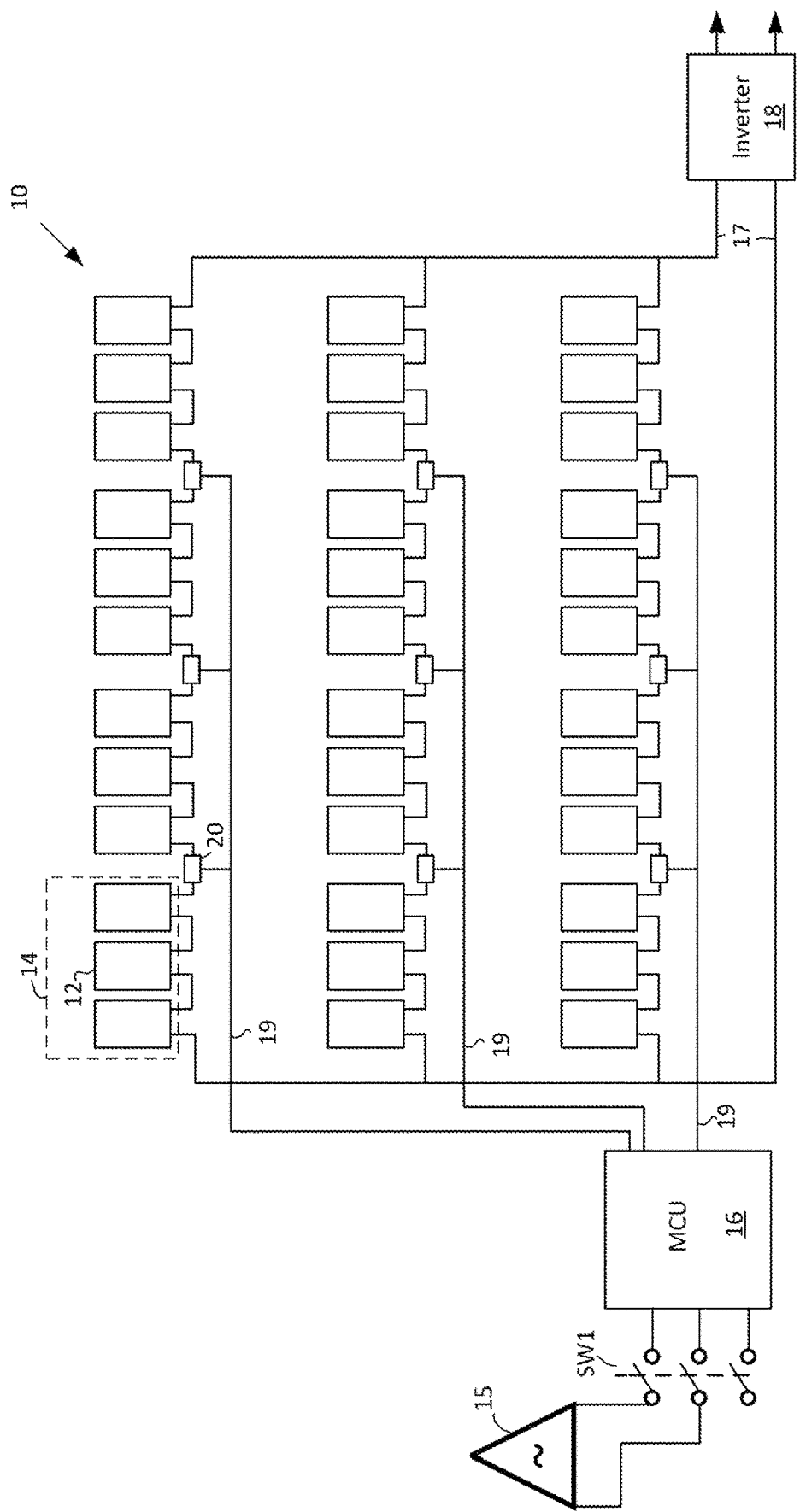
FIG. 1 is a block diagram showing an example solar power generation system 10, in accordance with an embodiment of the disclosure, and including plurality of cut-off devices 20.

Referring now to FIG. 1, a block diagram of an example solar power generation system 10 is shown, in accordance with an embodiment of the disclosure. Multiple strings of photovoltaic arrays (PVAs) 12 are connected together in parallel to provide a DC input to an inverter 18 that provides an AC output. Multiple cut-off devices (electronic control modules) 20 are provided to isolate sub-groups 14 of PVAs 12, so that the greatest voltage present in solar power generation system 10 is only the voltage of the series-connected panels in the sub-groups 14.

Figure 2:
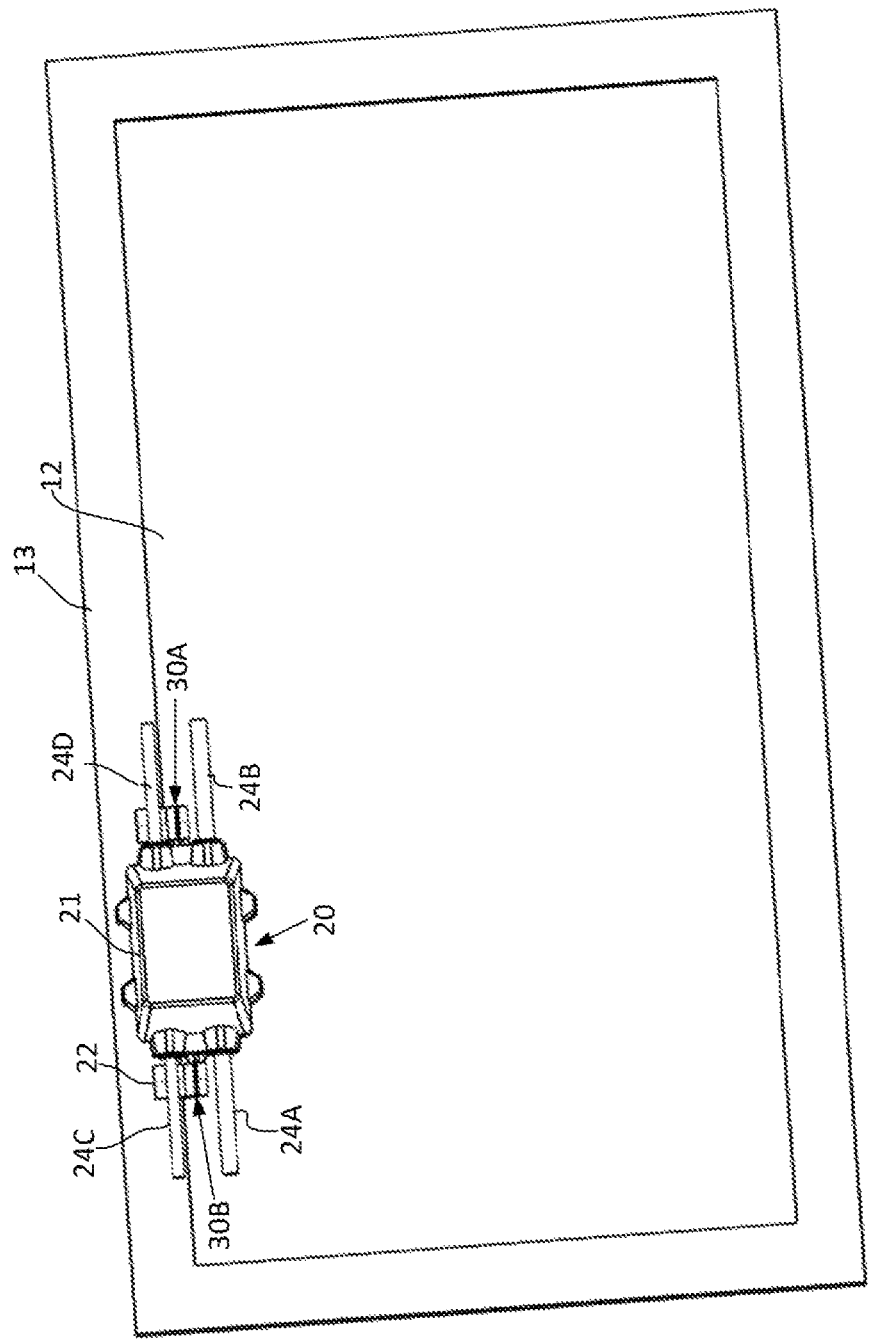
FIG. 2 is a perspective view showing an example installation of an example cut-off device 20 to a frame 13 of a PVA (solar panel) 12 within solar power generation system 10, in accordance with an embodiment of the disclosure.

Referring now to FIG. 2, a perspective view is shown of an example installation of a cut-off device 20 to a frame 13 of a PVA 12 within solar power generation system 10, in accordance with an embodiment of the disclosure. Cut-off device 20 includes a housing 21 that encloses the electronic components of cut-off device 20, and which includes a plurality of cables 24A-24D that extend through housing 21 for interconnection with other PVAs 12 and to power bus 17 and that receive control power signals as described in the above-incorporated U.S. patent application. Cut-off device 20 is only one example of a device that may be secured to a frame of a PVA, and other devices may be secured in a similar manner. Cut-off device 20 is secured using standard cable clips 22 that are used in other locations in solar power generation system, which in the depicted example, attach cut-off device 20 by mechanically coupling frame 13 to two protrusions 30A, 30B, that have a cross-section profile configured to approximate a cross-sectional profile of a standard interconnect cable, for example, cables 24A and 24B, for example, a circular profile of, e.g., 6 mm. A length of protrusions 30A, 30B, is sufficient to ensure that they will extend through the width of cable clips 22, e.g., 20-25 mm in length. Cable clips 22 may be any of a variety of standard cable clips in use in solar power generation system 10, which reduces the number of different items that must be supplied in inventory to install solar power generation system 10, and are configured for attachment of a standard cable to frame 13. By providing protrusions 30A, 30B, cut-off device is thereby configured to also attach to a standard cable clip.

Figure 3A:
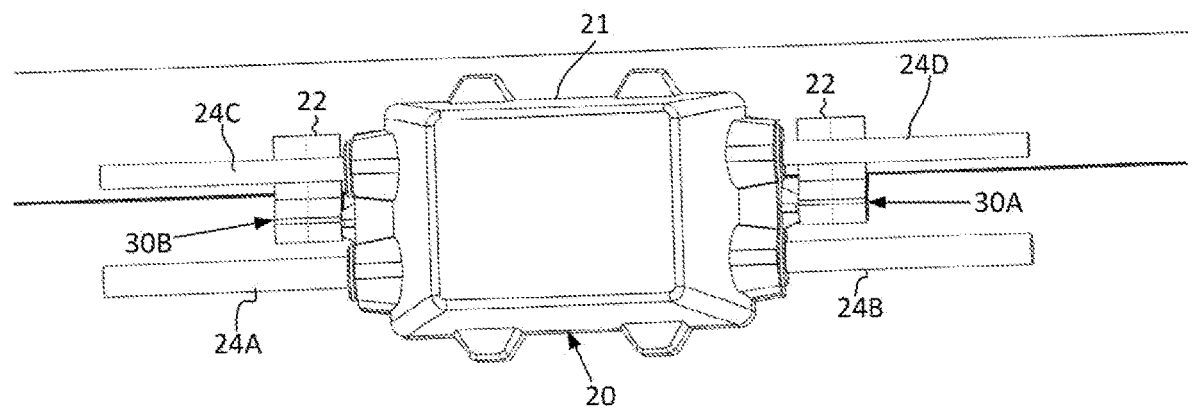
FIG. 3A is a top view and FIG. 3B is an exploded perspective view showing details of the example installation of FIG. 2 and an example cut-off device 20, in accordance with an embodiment of the disclosure.
Figure 3B:
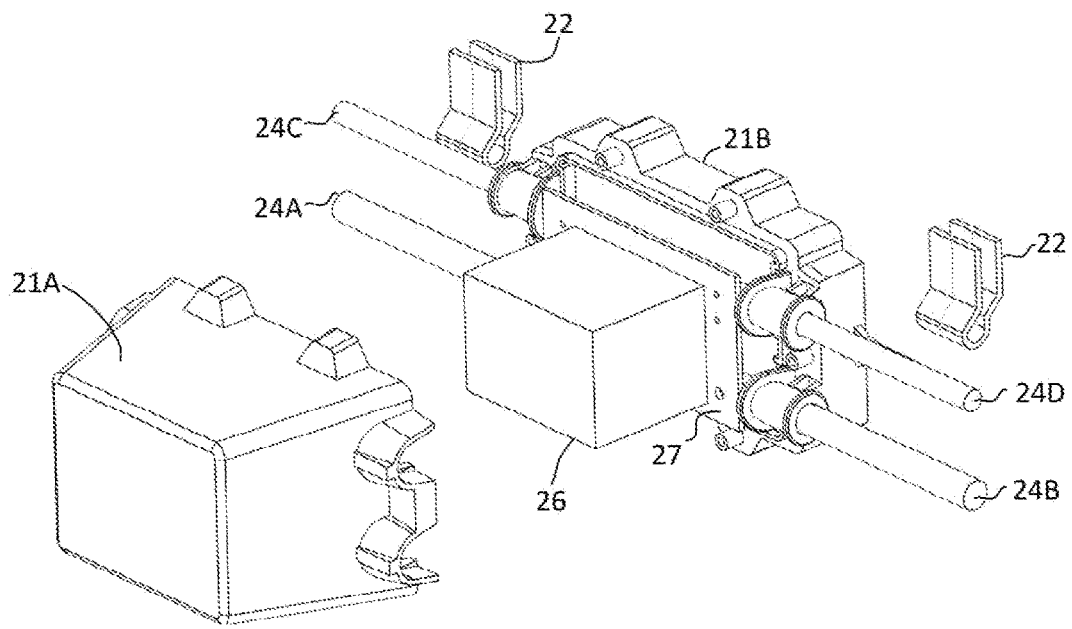

Referring now to FIG. 3A and FIG. 3B, a top view and an exploded perspective view, respectively, show details of the example installation of FIG. 2 and an example cut-off device 20, in accordance with an embodiment of the disclosure. FIG. 3A provides an expanded illustration of the mounting configuration of cut-off device, as described above. FIG. 3B shows an example housing 21 formed by a separable base portion 21B and cover portion 21A, in which a printed circuit board (PCB) 27 interconnects electronic components 26 of cut-off device and cables 24A-24D. While housing 21 provides an example of a separable housing, housings as used herein may be formed as a single piece and/or potted assemblies may provide the housing. Housings disclosed herein may be injection-molded, cast or machined plastic or metal, or may be 3D printed enclosures that are printed, in any of the embodiments disclosed herein.

Figure 3C:
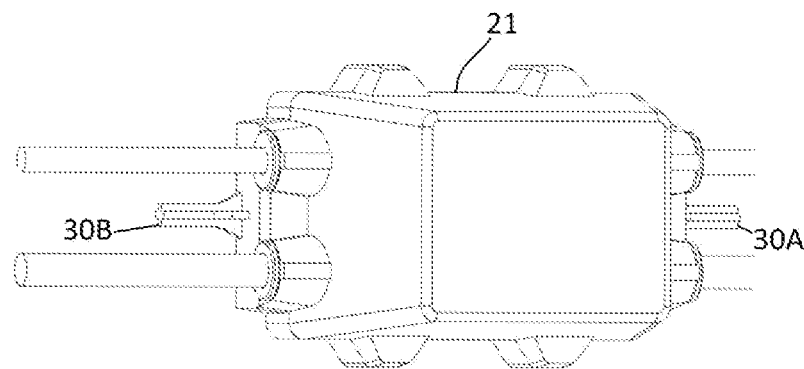
FIG. 3C is a left side perspective view.
Figure 3D:
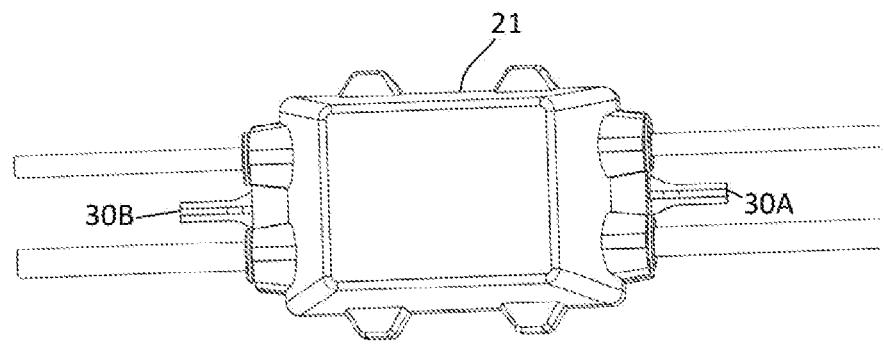
FIG. 3D is a top view.
Figure 3E:
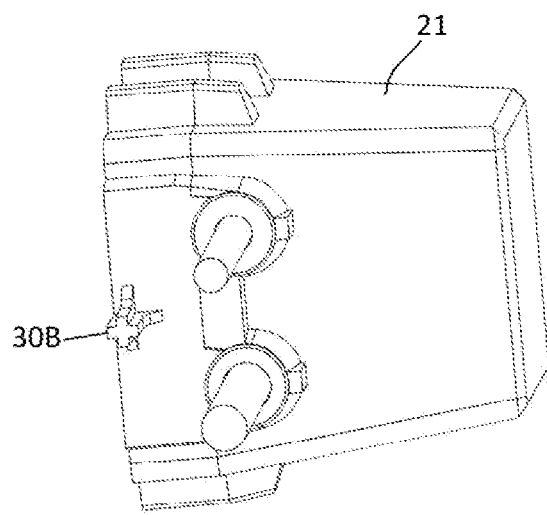
FIG. 3E is a front-left perspective view, of example cut-off device 20 of FIG. 2, FIG. 3A and FIG. 3B, in accordance with an embodiment of the disclosure.

Referring now to FIGS. 3C-3E a left side perspective view, a top view, and a front-left perspective view, respectively, are shown of example cut-off device 20 of FIG. 2, FIG. 3A and FIG. 3B, in accordance with an embodiment of the disclosure. Details of protrusions 30A, 30B are shown, in which the cross-sectional profile of protrusions 30A, 30B simulates the cross-sectional profile of a standard cable by two perpendicular extensions that intersect at the center of protrusions 30A, 30B, in the shape of a "+" sign, where each of the widths of the extensions is matches the diameter of a standard cable.

Figure 3F:
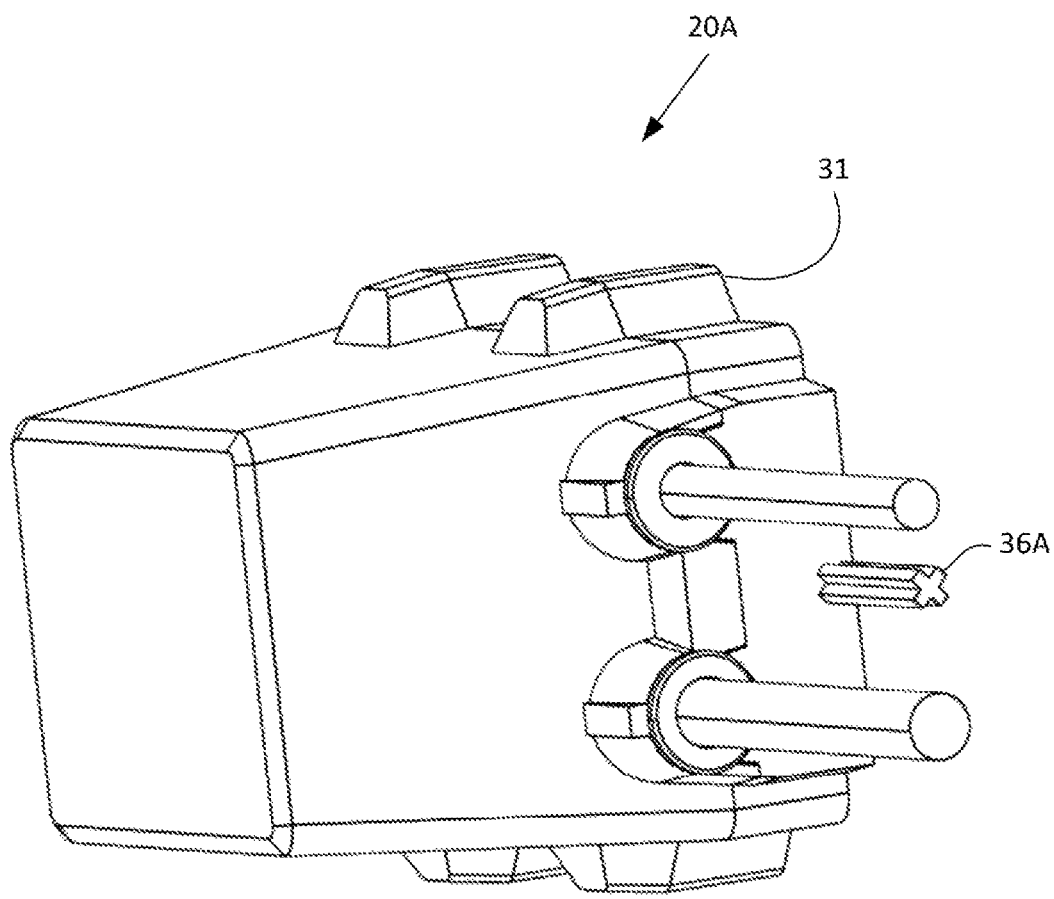
FIG. 3F is a right-side perspective view of another example cut-off device 20A that may be used in place of cut-off device 20 of FIG. 2, FIG. 3A and FIG. 3B in accordance with another embodiment of the disclosure.

Referring now to FIG. 3F, a right-side perspective view of another example cut-off device 20A that may be used in place of cut-off device 20 of FIG. 2, FIG. 3A and FIG. 3B is shown, in accordance with another embodiment of the disclosure. Cut-off device 20A is similar to cut-off device 20 as described above with reference to FIGS. 3A-3E, so only differences between them will be described below. A housing 31 of cut-off device 20A includes protrusions 36A and 36B (not shown, but which has an identical cross-sectional profile) that are similar to protrusions 30A, 30B as described above with reference to FIGS. 3A-3E, but that is rotated, to form the shape of a "X", formed by two rotated extensions that have a width that matches the diameter of a standard cable.

Figure 4B:
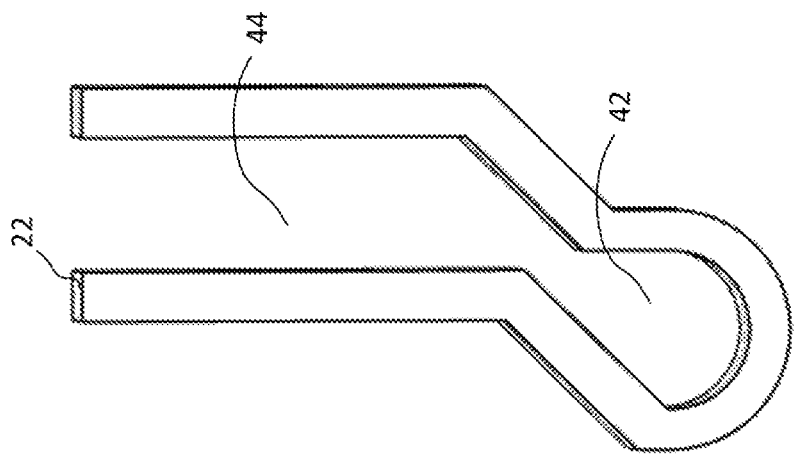
FIG. 4B is a side view, showing details of a cable clip 22 as shown in FIG. 2, FIG. 3A and FIG. 3B, in accordance with an embodiment of the disclosure.
Figure 4A:
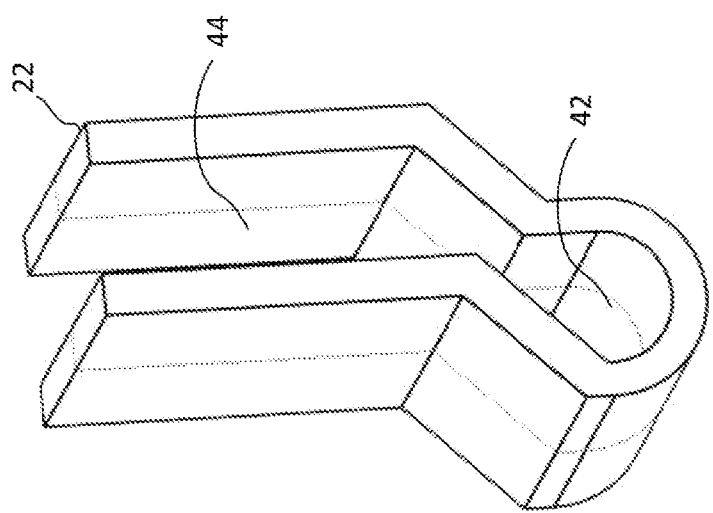
FIG. 4A is a perspective view.

Referring now to FIG. 4A and FIG. 4B, a perspective view and a side view, respectively, are shown of an example cable clip 22 as included in FIG. 2, FIG. 3A and FIG. 3B in accordance with an embodiment of the disclosure. A central void of example cable clip 22 includes two segments: a semicircular cross-section segment 42 that is configured to accept and secure, by compression, a standard round cable, and a rectangular cross-section segment 44 that accepts an edge of a frame, such as frame 13 of FIG. 2.

Figure 4C:
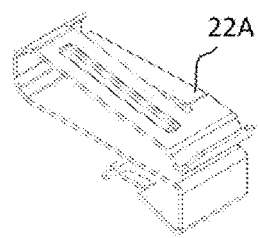
FIG. 4C is a perspective view.
Figure 4D:
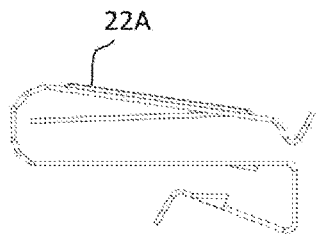
FIG. 4D is a side view, of a prior art cable clip 22A that may be used in installations in accordance with the embodiments of the disclosure.

FIG. 4C is a perspective view, and FIG. 4D is a side view, of a prior art cable clip 22A that may be used in installations in accordance with the embodiments of the disclosure. Depicted cable clip 22A expands to accept a circular profile cable on one side thereof, and has a short clip on the other side for engaging with frame 13 of a solar panel.

Figure 4E:
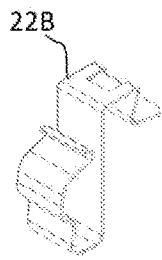
FIG. 4E is a perspective view.
Figure 4F:
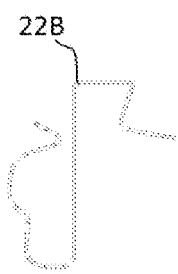
FIG. 4F is a side view, of a prior art cable clip 22B that may be used in installations in accordance with the embodiments of the disclosure.

FIG. 4E is a perspective view, and FIG. 4F is a side view, of a prior art cable clip 22B that may be used in installations in accordance with the embodiments of the disclosure. Depicted cable clip 22B has a semi-circular recess and also expands to accept a circular profile cable on one side thereof, and has a wide clip on the other side for engaging with frame 13 of a solar panel.

Figure 4G:
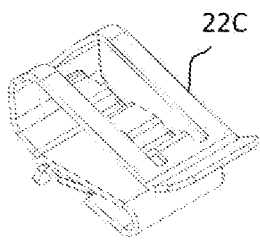
FIG. 4G is a perspective view.
Figure 4H:
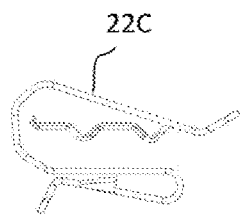
FIG. 4H is a side view, of another prior art cable clip 22C that may be used in installations in accordance with the embodiments of the disclosure.

FIG. 4G is a perspective view, and FIG. 4H is a side view, of another prior art cable clip 22C that may be used in installations in accordance with the embodiments of the disclosure. Depicted cable clip 22C has an internal tang that expands to accept a circular profile cable on one side thereof, and has a short clip on the other side for engaging with frame 13 of a solar panel.

Figure 4I:
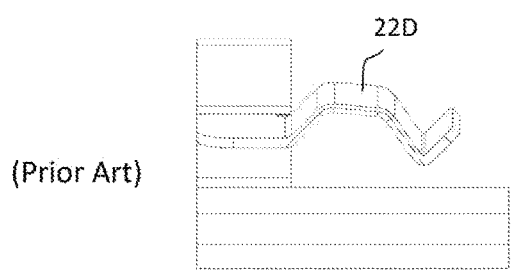
FIG. 4I is a perspective view.
Figure 4J:
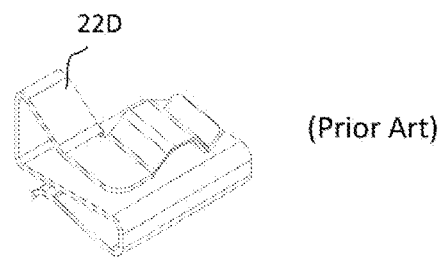
FIG. 4J is a side view, of another prior art cable clip 22D that may be used in installations in accordance with the embodiments of the disclosure.

FIG. 4I is a perspective view, and FIG. 4J is a side view, of another prior art cable clip 22D that may be used in installations in accordance with the embodiments of the disclosure. Depicted cable clip 22D has a bent extension to accept a circular profile cable on one side thereof, and has a wide clip on the other side for engaging with frame 13 of a solar panel. The direction of the recesses are perpendicular to each other, in contrast to the above-described cable clips, which makes clip 22D suitable for use near corners of frame 13 or for suspension via cables, where the cable direction is perpendicular to the direction of the protrusions on the housing of cut-off device 20.

Figure 4K:
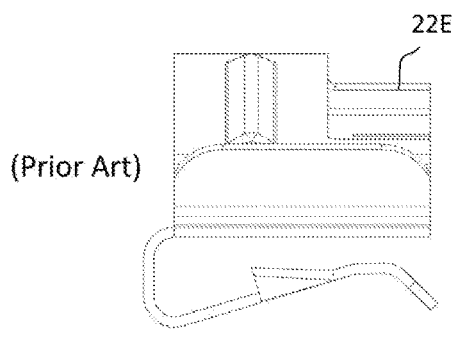
FIG. 4K is a side view.
Figure 4L:
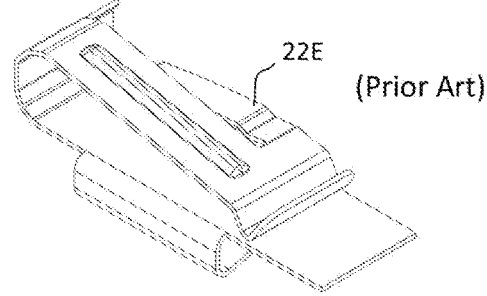
FIG. 4L is a perspective view.
Figure 4M:
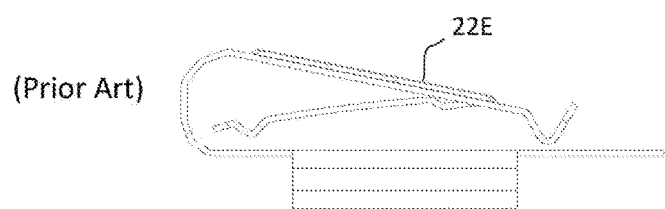
FIG. 4M is a front-end view, of another prior art cable clip 22E that may be used in installations in accordance with the embodiments of the disclosure.

FIG. 4K is a side view, FIG. 4L is a perspective view, and FIG. 4M is a front-end view, of another prior art cable clip 22E that may be used in installations in accordance with the embodiments of the disclosure. Clip 22E also has a perpendicular orientation between the cable recess and the frame-accepting recess.

Figure 4N:
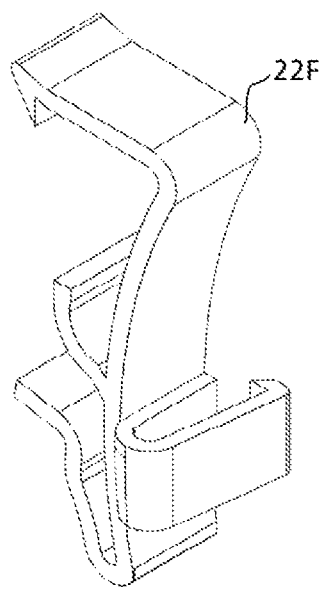
FIG. 4N is a side view and FIG. 4O is a perspective view, of another prior art cable clip 22F that may be used in installations in accordance with the embodiments of the disclosure.
Figure 4O:
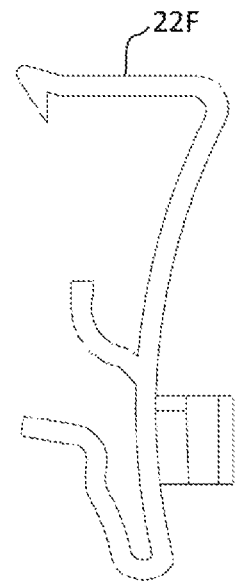

FIG. 4N is a side view and FIG. 4O is a perspective view, of another prior art cable clip 22F that may be used in installations in accordance with the embodiments of the disclosure.

Figure 4P:
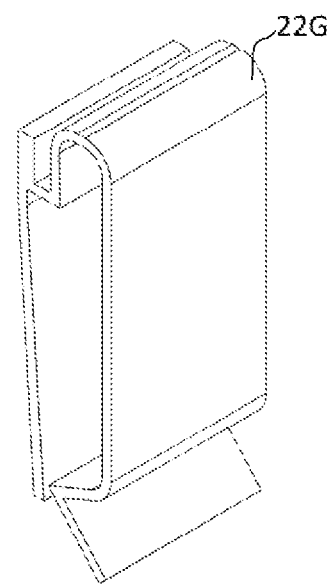
FIG. 4P is a side view and FIG. 4Q is a perspective view, of another example cable clip 22G that may be used in installations in accordance with the embodiments of the disclosure.
Figure 4Q:
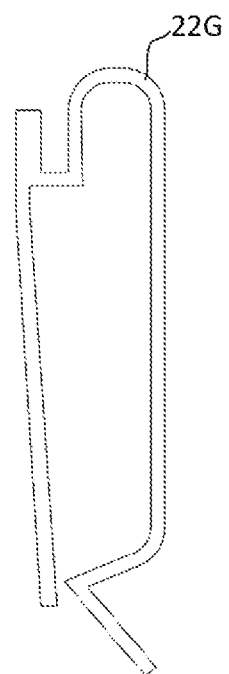

FIG. 4P is a side view and FIG. 4Q is a perspective view, of another cable clip 22G that may be used in installations in accordance with the embodiments of the disclosure. Clip 22G accepts a frame edge and one or more cables/protrusions in the same recess.

Figure 5A:
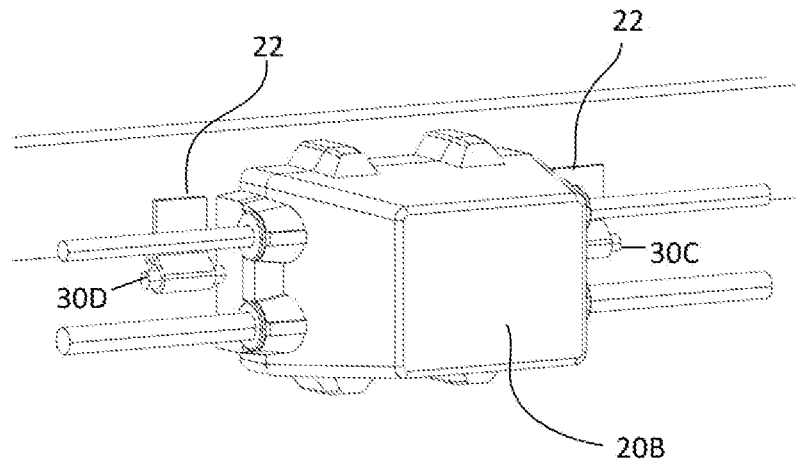
FIG. 5A is an installed left side perspective view.
Figure 5B:
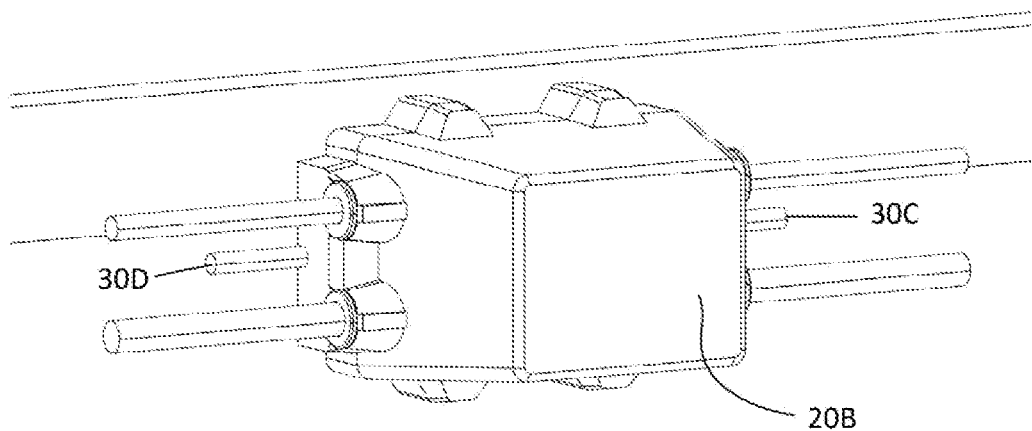
FIG. 5B is a bare left-side perspective view.
Figure 5C:
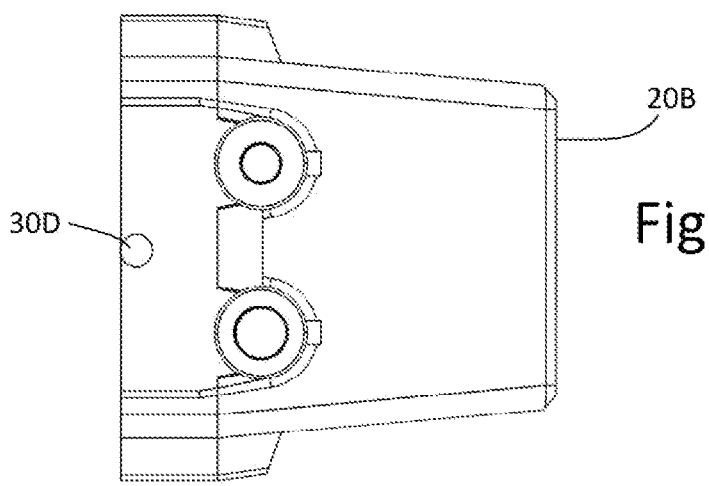
FIG. 5C is a left side view, of another example cut-off device 20B that may be used in place of example cut-off device in FIG. 2, FIG. 3A and FIG. 3B in accordance with another embodiment of the disclosure.

Referring now to FIG. 5A, FIG. 5B, and FIG. 5C, an installed left side perspective view, a bare left-side perspective view, and a left side view, respectively, are shown of another example cut-off device 20B that may be used in place of example cut-off device in FIG. 2, FIG. 3A and FIG. 3B in accordance with another embodiment of the disclosure. Cut-off device 20B is similar to cut-off device 20 as described above with reference to FIGS. 3A-3E, so only differences between them will be described below. Cut-off device 20B has protrusions 30C, 30D with a circular cross-sectional profile, directly simulating a standard cable of the same diameter.

Figure 6A:
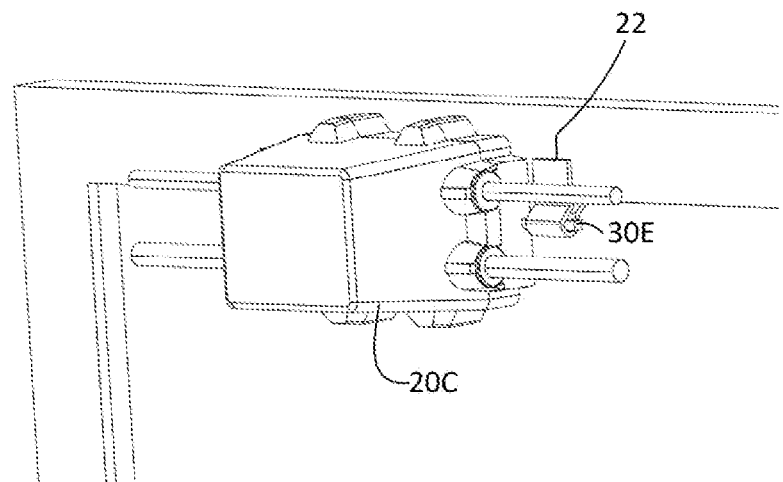
FIG. 6A is an installed right side perspective view.
Figure 6B:
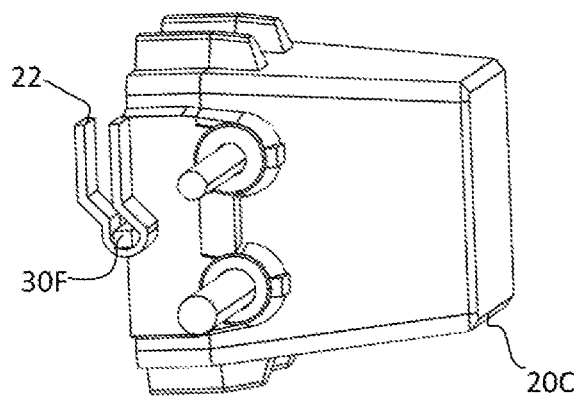
FIG. 6B is a left-side perspective view showing a position of cable clip 22.
Figure 6C:
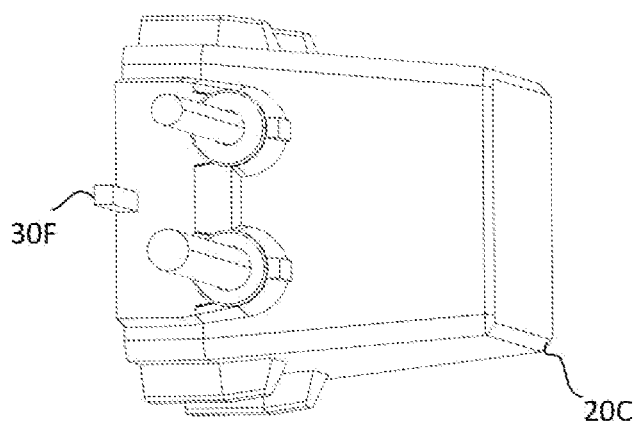
FIG. 6C is a bare left side view, of another example cut-off device 20C that may be used in place of example cut-off device in FIG. 2, FIG. 3A and FIG. 3B in accordance with another embodiment of the disclosure.

FIG. 6A is an installed right side perspective view, FIG. 6B is a left-side perspective view showing a position of cable clip 22, and FIG. 6C is a bare left side view, of another example cut-off device 20C that may be used in place of example cut-off device in FIG. 2, FIG. 3A and FIG. 3B in accordance with another embodiment of the disclosure. Cut-off device 20C is similar to cut-off device 20 as described above with reference to FIGS. 3A-3E, so only differences between them will be described below. Cut-off device 20C has protrusions 30E, 30E with a square cross-sectional profile, simulating a standard cable having a diameter that is √2 times the length of the sides of the square cross-sectional profile.

FIG. 7A is an installed right side perspective view, FIG. 7B is a bare upper right-side perspective view, FIG. 7C is a bare top view, and FIG. 7D is a bare left side view, of another example cut-off device 20D that may be used in place of example cut-off device in FIG. 2, FIG. 3A and FIG. 3B in accordance with another embodiment of the disclosure. Cut-off device 20D is similar to cut-off device 20 as described above with reference to FIGS. 3A-3E, so only differences between them will be described below. Cut-off device 20D has protrusions 30G with a rectangular cross-sectional profile in a proximal section 74 thereof and that terminates in an expanded distal portion 72. Rectangular proximal section 74 is sized to cause cable clips 22 to expand and capture protrusions 30G, and expanded distal portion 72 prevents lateral movement that might cause protrusions 30G to exit cable clips 22

Figure 8A:
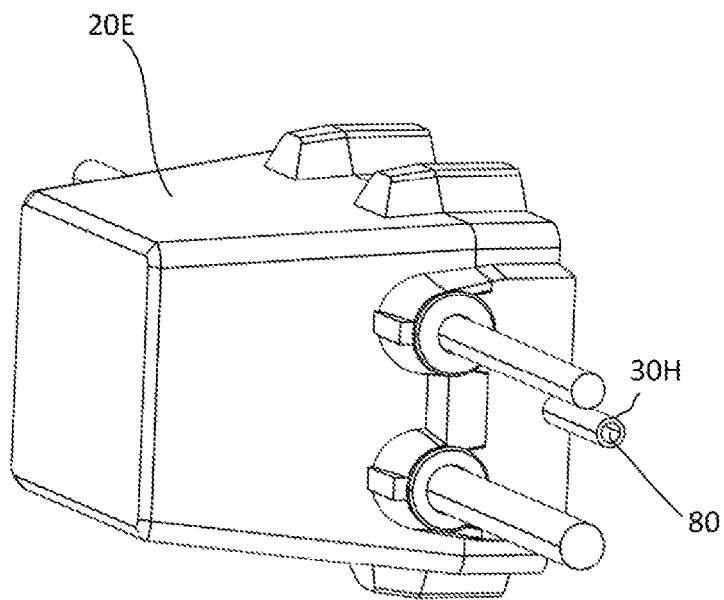
FIG. 8A is a right-side perspective view.
Figure 8B:
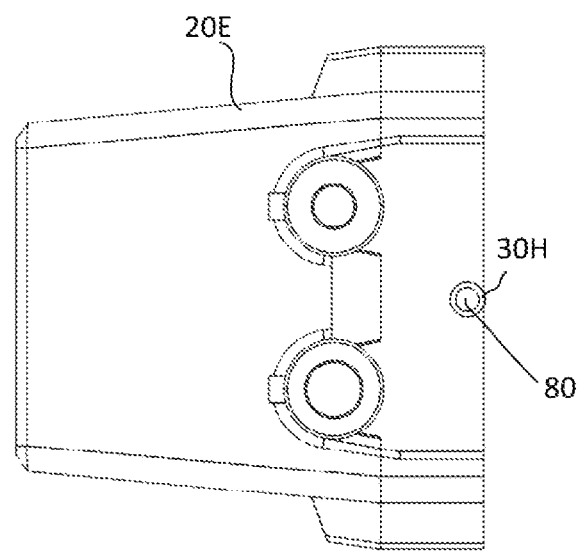
FIG. 8B is a right side view, of another example cut-off device 20E that may be used in place of example cut-off device in FIG. 2, FIG. 3A and FIG. 3B in accordance with another embodiment of the disclosure.

FIG. 8A is a right side perspective view, and FIG. 8B is a right side view, of another example cut-off device 20E that may be used in place of example cut-off device in FIG. 2, FIG. 3A and FIG. 3B in accordance with another embodiment of the disclosure. Cut-off device 20E is similar to cut-off device 20 as described above with reference to FIGS. 3A-3E, so only differences between them will be described below. Cut-off device 20F has protrusions 30H with a circular cross-sectional profile similar to cut-off device 20B of FIGS. 5A-5C, directly simulating a standard cable of the same diameter, but having walls defining a central cylindrical void 80 to provide a hollow tube, that may improve bending strength, depending on the material, and reducing weight.

Figure 9A:
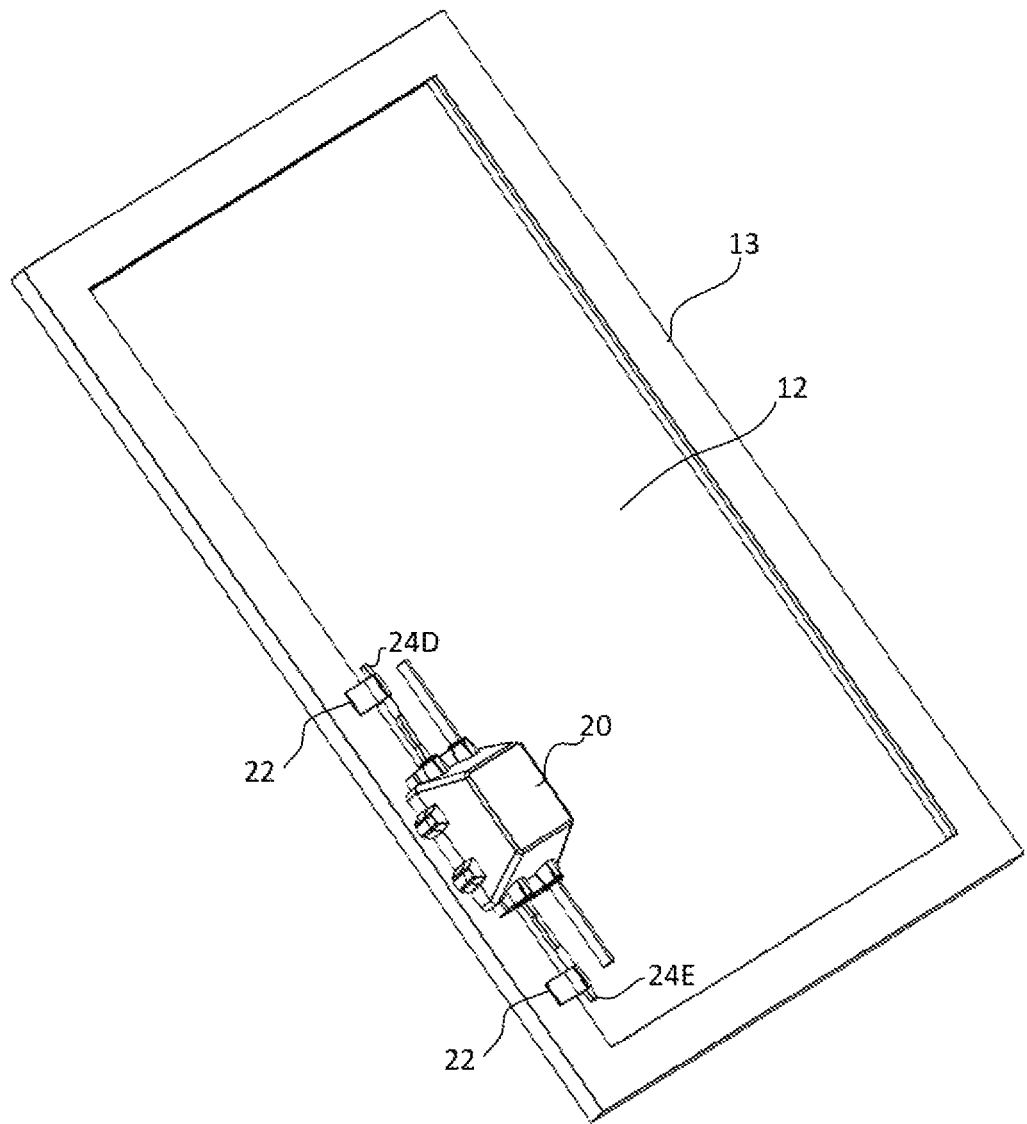
FIG. 9A is a perspective view.
Figure 9B:
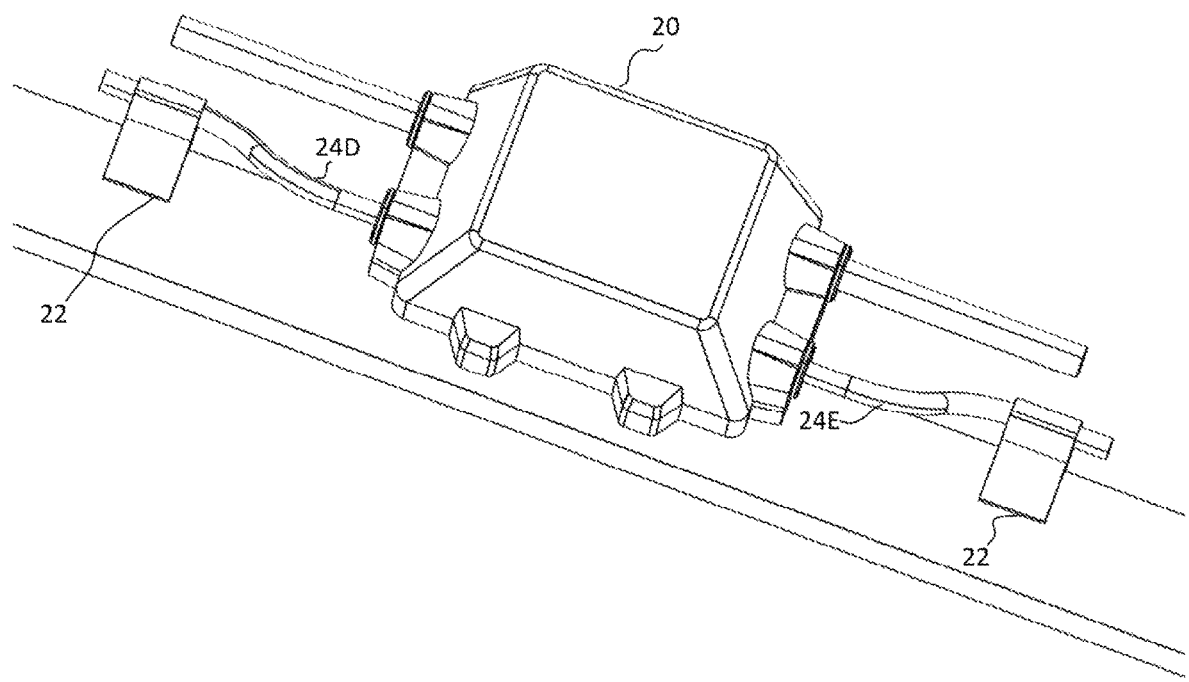
FIG. 9B is a detailed perspective view, showing another example installation of example cut-off device 20 to a frame 13 of a solar panel 12 within solar power generation system 10, in accordance with another embodiment of the disclosure.

FIG. 9A is a perspective view, and FIG. 9B is a detailed perspective view, showing another example installation of example cut-off device 20 to a frame 13 of a solar panel 12 within solar power generation system 10, in accordance with another embodiment of the disclosure. In contrast to the installation illustrated in FIG. 2, example installation of FIG. 9A uses standard cable clamps 22 to secure cut-off device 20 to frame 13 by securing cables 24C and 24D to frame 13. Protrusions are not required on housing 21 of cut-off device 20. In other combinations, when protrusions are provided, one protrusion may be secured and a cable secured on the other side of cut-off-device 20, providing flexibility of installation depending on the proximity of frame 12 to the sides of cut-off-device 20, and depending on where cables are located. For example, a cut-off device, or other electronic device to be secured to frame 13, may have cables extending from one side, which may be secured with a cable clip, and the other side of the electronic device may be secured by a protrusion that simulates a cable, using a standard cable clip.

Figure 10A:
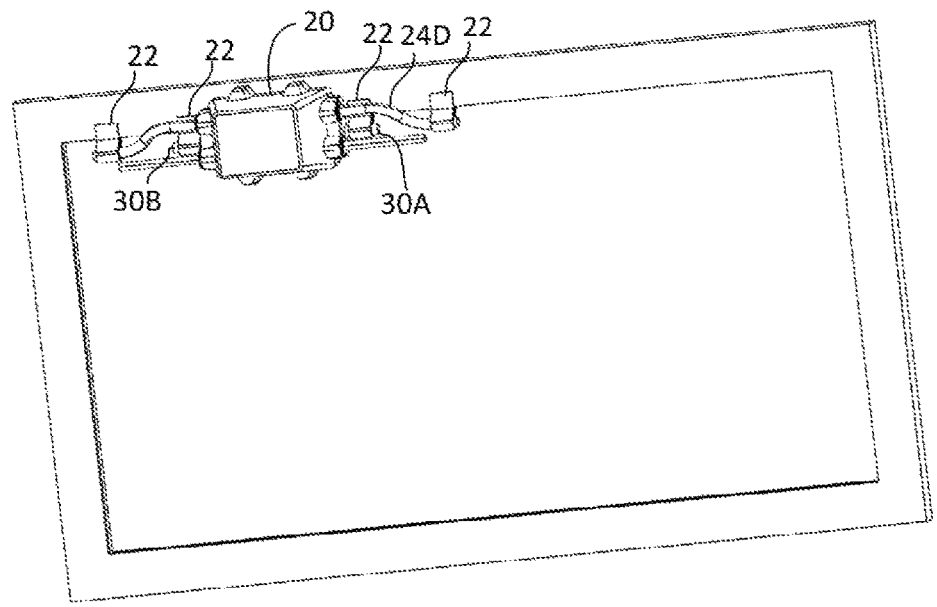
FIG. 10A is a perspective view.
Figure 10B:
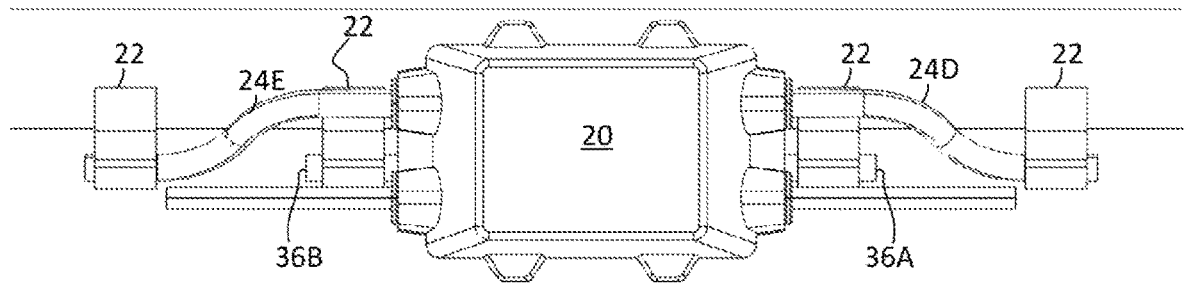
FIG. 10B is a detailed top view, showing another example installation of example cut-off device 20 to a frame 13 of a solar panel 12 within solar power generation system 10, in accordance with another embodiment of the disclosure.

FIG. 10A is a perspective view, and FIG. 10B is a detailed top view, showing another example installation of example cut-off device 20 to a frame 13 of a solar panel 12 within solar power generation system 10, in accordance with another embodiment of the disclosure. The example installation of FIG. 10A and FIG. 10B uses multiple sets of standard cable clamps 22 to secure cut-off device 20 to frame 13 by securing both protrusions 30A and 30B, as well as cables 24C and 24D to frame 13 with individual cable clamps 22.

In summary, this disclosure shows and describes example solar power generation systems, electronic control modules for solar power generation systems, and their methods of installation. The system is a system installed by the method, and may include an electronic control module having a housing that has protrusions having a cross-sectional profile configured to approximate a cross-sectional profile of a standard cable, so that the housing may be secured to a frame of a solar panel with a standard cable clip. The installation methods may include electrically connecting at least one electrical connection of the electronic control module to the solar power generation system with one or more cables extending from a housing of the electronic control module, providing a pair of identical cable clips configured for attachment of a standard cable to a frame of the solar panel, first securing a first one of the one or more cables or a first protrusion extending from the housing to the frame of the solar panel with a first one of the pair of cable clips, and second securing a second one of the one or more cables or a second protrusion extending from the housing to the frame of the solar panel with a second one of the pair of cable clips.

In some embodiments, the first securing may secure the first protrusion of the housing to the frame of the solar panel with the first one of the pair of cable clips, and the second securing may secure the second protrusion of the housing to the frame of the solar panel with the second one of the pair of cable clips. In other embodiments, the first securing may secure the first one of the one or more cables to the frame of the solar panel with the first one of the pair of cable clips, and the second securing may secure the second one of the one or more cables to the frame of the solar panel with the second one of the pair of cable clips, so that the housing is secured to the frame of the solar panel via attachment to the first and second one of the one or more cables. In some embodiments, the method may include providing another pair of cable clips configured for attachment of cables to a solar panel, third securing a first protrusion extending from the housing to a frame of the solar panel with a first one of the other pair of cable clips, and fourth securing a second protrusion extending from the housing to a frame of the solar panel with a second one of the other pair of cable clips.

In some embodiments, the housing may be a formed plastic housing, with the first protrusion and the second protrusion formed as extensions on either end of the housing. In some embodiments, the housing may include a base portion securing an electronic circuit of the electronic control module, and a removable cover portion detachable from the base portion, and wherein the first protrusion and the second protrusion are formed as extensions of the base portion, one on each side thereof. In some embodiments, the protrusions may have circular cross-sections conformed to a diameter of the one or more cables. In some embodiments the protrusions may have an annular cross-section, so that the protrusions are hollow, and an outer diameter of the annular cross-section may be conformed to the diameter of the one or more cables. In some embodiments, the protrusions may have cross-sections formed by two extensions perpendicular to each other in a cross-sectional plane thereof, and the extensions may have a length conformed to a diameter of the one or more cables. In some embodiments, the protrusions may have a rectangular cross-section having an expanded distal portion, whereby the expanded portion of the protrusions have a width greater than a diameter of the one or more cables, so that a proximal edge of the expanded portion of the protrusions prevents lateral movement of the module with respect to the pair of cable clips.

While the disclosure has shown and described particular embodiments of the techniques disclosed herein, it will be understood by those skilled in the art that the foregoing and other changes in form, and details may be made therein without departing from the spirit and scope of the disclosure. For example, the mounting techniques shown above may be applied to other types of electronic modules in a solar power generation system.

What is claimed is:

1. A method of securing an electronic control module to a frame of a solar panel of a solar power generation system, the method comprising:
    electrically connecting at least one electrical connection of the electronic control module to the solar power generation system with one or more cables extending from a housing of the electronic control module;
    providing a pair of identical cable clips configured for attachment of cables of a type matching the one or more cables to the frame of the solar panel;
    first securing a first protrusion extending from the housing to the frame of the solar panel with a first one of the pair of cable clips; and
    second securing a second protrusion extending from the housing to the frame of the solar panel with a second one of the pair of cable clips.

2. The method of claim 1, wherein the housing is a formed plastic housing, wherein the first protrusion and the second protrusion are formed as extensions on either end of the housing.

3. The method of claim 2, wherein the housing comprises:
    a base portion securing an electronic circuit of the electronic control module; and
    a removable cover portion detachable from the base portion, and wherein the first protrusion and the second protrusion are formed as extensions of the base portion, one on each side thereof.

4. The method of claim 1, wherein the protrusions have circular cross-sections conformed to a diameter of the one or more cables.

5. The method of claim 4, wherein the protrusions have an annular cross-section, whereby the protrusions are hollow, and wherein an outer diameter of the annular cross-section is conformed to the diameter of the one or more cables.

6. The method of claim 1, wherein the protrusions have cross-section formed by two extensions perpendicular to each other in a cross-sectional plane thereof, and wherein the extensions have a length conformed to a diameter of the one or more cables.

7. The method of claim 1, wherein the protrusions have a rectangular cross-section.

8. The method of claim 1, further comprising:
    providing another pair of the cable clips configured for attachment of cables of a type matching the one or more cables to the solar panel;
    third securing a first cable connected to the housing to the frame of the solar panel with a first one of the another pair of cable clips; and fourth securing a second cable connected to the housing to the frame of the solar panel with a second one of the another pair of cable clips.

9. The method of claim 7, wherein the protrusions have an expanded distal portion, whereby the expanded portion of the protrusions have a width greater than a diameter of the one or more cables, so that a proximal edge of the expanded portion of the protrusions prevents lateral movement of the module with respect to the pair of cable clips.

10. The method of claim 1, wherein the electronic control module is only connected to the solar panel and an adjacent solar panel by a single pair of connections made to the solar panel and the adjacent solar panel, so that the electronic control module does not receive both of a power connection and an associated return connection from either of the solar panel nor the adjacent solar panel.

11. A solar power generation system, comprising:
a solar panel;
an electronic control module electrically coupled to the solar panel by one or more cables extending from a housing of the electronic control module; and
a pair of identical cable clips configured for attachment of cables of a type matching the one or more cables to the solar panel, wherein a first protrusion extending from the housing is secured to a frame of the solar panel with a first one of the pair of cable clips, and wherein a second protrusion extending from the housing is secured to the frame of the solar panel with a second one of the pair of cable clips.

12. The solar power generation system of claim 11, wherein the housing is a formed plastic housing, wherein the first protrusion and the second protrusion are formed as extensions on either end of the formed plastic housing.

13. The solar power generation system of claim 11, further comprising another pair of cable clips, wherein a first cable connected to the housing is secured to the frame of the solar panel with the first one of the another pair of cable clips, and wherein a second cable connected to the housing is secured to the frame of the solar panel with the second one of the another pair of cable clips.

14. The system of claim 11, wherein the electronic control module is only connected to the solar panel and an adjacent solar panel by a single pair of connections made to the solar panel and the adjacent solar panel, so that the electronic control module does not receive both of a power connection and an associated return connection from either of the solar panel nor the adjacent solar panel.

15. An electronic control module for installation at a solar panel of a solar power generation system, the electronic control module comprising:
an electronic circuit;
a housing forming an enclosure surrounding the electronic circuit;
one or more cables extending from the electronic circuit and through the housing to provided electrical interconnection to the electronic circuit; and
a pair of protrusions extending from the housing and configured for acceptance by cable-retaining features of a pair of cable clips, whereby the housing may be secured to a frame of the solar panel by the pair of cable clips.

16. The electronic control module of claim 15, wherein the housing is a formed plastic housing, wherein the first protrusion and the second protrusion are formed as extensions on either end of the formed plastic housing.

17. The electronic control module of claim 16, wherein the formed plastic housing comprises:
a base portion securing an electronic circuit of the electronic control module; and
a removable cover portion detachable from the base portion, and wherein the first protrusion and the second protrusion are formed as extensions of the base portion, one on each side thereof.

18. The electronic control module of claim 15, wherein the protrusions have circular cross-sections conformed to a diameter of the cables.

19. The electronic control module of claim 18, wherein the protrusions have an annular cross-section, whereby the protrusions are hollow, and wherein an outer diameter of the annular cross-section is conformed to the diameter of the cables.

20. The electronic control module of claim 15, wherein the protrusions have cross-section formed by two extensions perpendicular to each other in a cross-sectional plane thereof, and wherein the extensions have a length conformed to a diameter of the cables.

21. The electronic control module of claim 15, wherein the protrusions have a rectangular cross-section.

22. The electronic control module of claim 21, wherein the protrusions have an expanded distal portion, whereby the expanded portion of the protrusions have a width greater than a diameter of the one or more cables, so that a proximal edge of the expanded portion of the protrusions prevents lateral movement of the module with respect to the pair of cable clips.

* * * * *